United States Patent
Yamaguchi (12) 
(10) Patent No.: US 9,963,808 B2
(45) Date of Patent: May 8, 2018

(54) KNIT EMI SHIELD AND METHOD OF CONSTRUCTION THEREOF

(71) Applicant: Federal-Mogul Powertrain, Inc., Southfield, MI (US)

(72) Inventor: Hiroki Yamaguchi, Kanagawa (JP)

(73) Assignee: Federal-Mogul Powertrain LLC, Southfield, MI (US)

( * ) Notice: Subject to any disclaimer, the term of this patent is extended or adjusted under 35 U.S.C. 154(b) by 474 days.

(21) Appl. No.: 14/643,638

(22) Filed: Mar. 10, 2015

(65) Prior Publication Data

US 2015/0366112 A1    Dec. 17, 2015

Related U.S. Application Data (60) Provisional application No. 62/010,910, filed on Jun. 11, 2014.

(51) Int. Cl.
*D04B 21/12* (2006.01)
*D04B 1/14* (2006.01)
(Continued)

(52) U.S. Cl.
CPC ............ *D04B 21/12* (2013.01); *D04B 1/14* (2013.01); *D04B 21/14* (2013.01); *H05K 9/009* (2013.01); *D10B 2401/16* (2013.01)

(58) Field of Classification Search
CPC ........ D04B 21/14; D04B 21/16; D04B 21/20; D04B 21/205
See application file for complete search history.

(56) References Cited

U.S. PATENT DOCUMENTS

| | | | | |
|---|---|---|---|---|
| 4,684,762 A | * | 8/1987 | Gladfelter | D03D 15/00 139/425 R |
| 4,753,088 A | * | 6/1988 | Harrison | D04B 21/12 2/125 |

(Continued)

FOREIGN PATENT DOCUMENTS

GB    2385605 A    8/2003

OTHER PUBLICATIONS

International Search Report, dated Jun. 5, 2015 (PCT/US2015/019863).

*Primary Examiner* — Danny Worrell
(74) *Attorney, Agent, or Firm* — Robert L. Stearns; Dickinson Wright, PLLC (57) ABSTRACT

An electromagnetic interference (EMI) shield assembly and method of construction is provided. The assembly includes a body having a wall of warp knit nonmetallic yarn having opposite sides extending generally parallel with one another between opposite ends and a plurality of weft inserted metal wires. The wire is inserted to provide discrete bundles each arranged in side-by-side relation with one another and extending beyond the opposite sides of the wall to provide a plurality of exposed free ends. The nonmetallic yarn is looped about the wires, thereby fixing the wire relative to the nonmetallic yarn and to other wires in an optimal EMI shielding position. Metal brackets adapted for ready attachment to a source of electrical ground are attached to the exposed free ends. The individual bundles of wires extend parallel to one another, with a gap having a predetermined width extending between the adjacent bundles.

19 Claims, 6 Drawing Sheets

(51) Int. Cl.
*D04B 21/14* (2006.01)
*H05K 9/00* (2006.01)

(56) References Cited

U.S. PATENT DOCUMENTS

| | | | | |
|---|---|---|---|---|
| 4,983,814 A * | 1/1991 | Ohgushi | ................ | D02G 3/441 |
| | | | | 219/212 |
| 5,074,129 A * | 12/1991 | Matthew | ................ | D04B 21/12 |
| | | | | 66/192 |
| 5,416,961 A * | 5/1995 | Vinay | ................... | D04B 21/14 |
| | | | | 28/165 |
| 5,512,709 A | 4/1996 | Jencks et al. | | |
| 5,727,401 A * | 3/1998 | Statham | ............ | A41D 31/0022 |
| | | | | 2/458 |
| 6,047,203 A * | 4/2000 | Sackner | ............ | A41D 13/1281 |
| | | | | 600/301 |
| 6,082,144 A * | 7/2000 | Jencks | ................ | D04B 21/20 |
| | | | | 66/170 |
| 6,089,051 A * | 7/2000 | Gorywoda | ............... | B01J 35/06 |
| | | | | 442/316 |
| 6,161,399 A * | 12/2000 | Jayaraman | ............... | D04B 1/14 |
| | | | | 623/1.5 |
| 6,219,906 B1 | 4/2001 | Sosnowski | | |
| 6,222,126 B1 | 4/2001 | Strange et al. | | |
| 6,341,504 B1 * | 1/2002 | Istook | ................ | A61B 5/0002 |
| | | | | 2/69 |
| 6,639,148 B2 * | 10/2003 | Marks | ................... | D04C 1/06 |
| | | | | 174/117 M |
| 6,711,920 B2 | 3/2004 | Akers et al. | | |
| 6,738,265 B1 | 5/2004 | Svarfvar et al. | | |
| 6,941,775 B2 * | 9/2005 | Sharma | ............. | A41D 13/1281 |
| | | | | 2/902 |
| 7,028,510 B1 * | 4/2006 | DaRosa | ................. | D04B 21/20 |
| | | | | 66/170 |
| 7,191,803 B2 * | 3/2007 | Orr | ...................... | A61B 5/0002 |
| | | | | 139/408 |
| 7,469,563 B2 * | 12/2008 | Wahlgren | .................. | F01N 1/24 |
| | | | | 66/169 R |
| 7,576,286 B2 * | 8/2009 | Chen | ...................... | D02G 3/441 |
| | | | | 174/117 M |
| 7,870,761 B2 * | 1/2011 | Valentine | ............. | A61B 5/0408 |
| | | | | 66/171 |
| 7,878,030 B2 * | 2/2011 | Burr | ....................... | D04B 1/14 |
| | | | | 66/173 |
| 8,171,755 B2 * | 5/2012 | Jahn | ........................ | D04B 1/16 |
| | | | | 66/170 |
| 8,283,563 B2 * | 10/2012 | Harris | .................... | D02G 3/441 |
| | | | | 174/117 M |
| 8,443,634 B2 * | 5/2013 | Scheffler | ............ | A61B 5/04085 |
| | | | | 66/170 |
| 8,728,959 B2 | 5/2014 | Chung et al. | | |
| 8,887,534 B2 * | 11/2014 | Garcia | ..................... | B32B 5/26 |
| | | | | 66/202 |
| 8,966,942 B2 * | 3/2015 | Dias | ........................ | D04B 1/14 |
| | | | | 66/170 |
| 9,362,725 B2 * | 6/2016 | Morris | ..................... | H02G 3/0412 |
| 9,416,470 B2 * | 8/2016 | Shoshani | ................. | D04B 1/18 |
| 9,644,291 B1 * | 5/2017 | Kuo | ........................ | D04B 1/14 |
| 2002/0195260 A1 | 12/2002 | Marks | | |
| 2005/0124249 A1 | 6/2005 | Uribarri | | |
| 2006/0281382 A1 | 12/2006 | Karayianni et al. | | |
| 2007/0275199 A1 | 11/2007 | Chen | | |
| 2009/0159149 A1 | 6/2009 | Karayianni et al. | | |
| 2014/0273699 A1 * | 9/2014 | Zhang | ................... | D04B 21/14 |
| | | | | 442/316 |
| 2015/0366112 A1 * | 12/2015 | Yamaguchi | ............ | D04B 21/14 |
| | | | | 174/385 |

* cited by examiner

KNIT EMI SHIELD AND METHOD OF CONSTRUCTION THEREOF

CROSS REFERENCE TO RELATED APPLICATION

This application claims the benefit of U.S. Provisional Application Ser. No. 62/010,910 filed Jun. 11, 2014, which is incorporated herein by reference in its entirety.

BACKGROUND OF THE INVENTION

1. Field of the Invention

This invention relates generally to electromagnetic interference shields, and more particularly to textile electromagnetic interference shields.

2. Related Art

Figure 1:
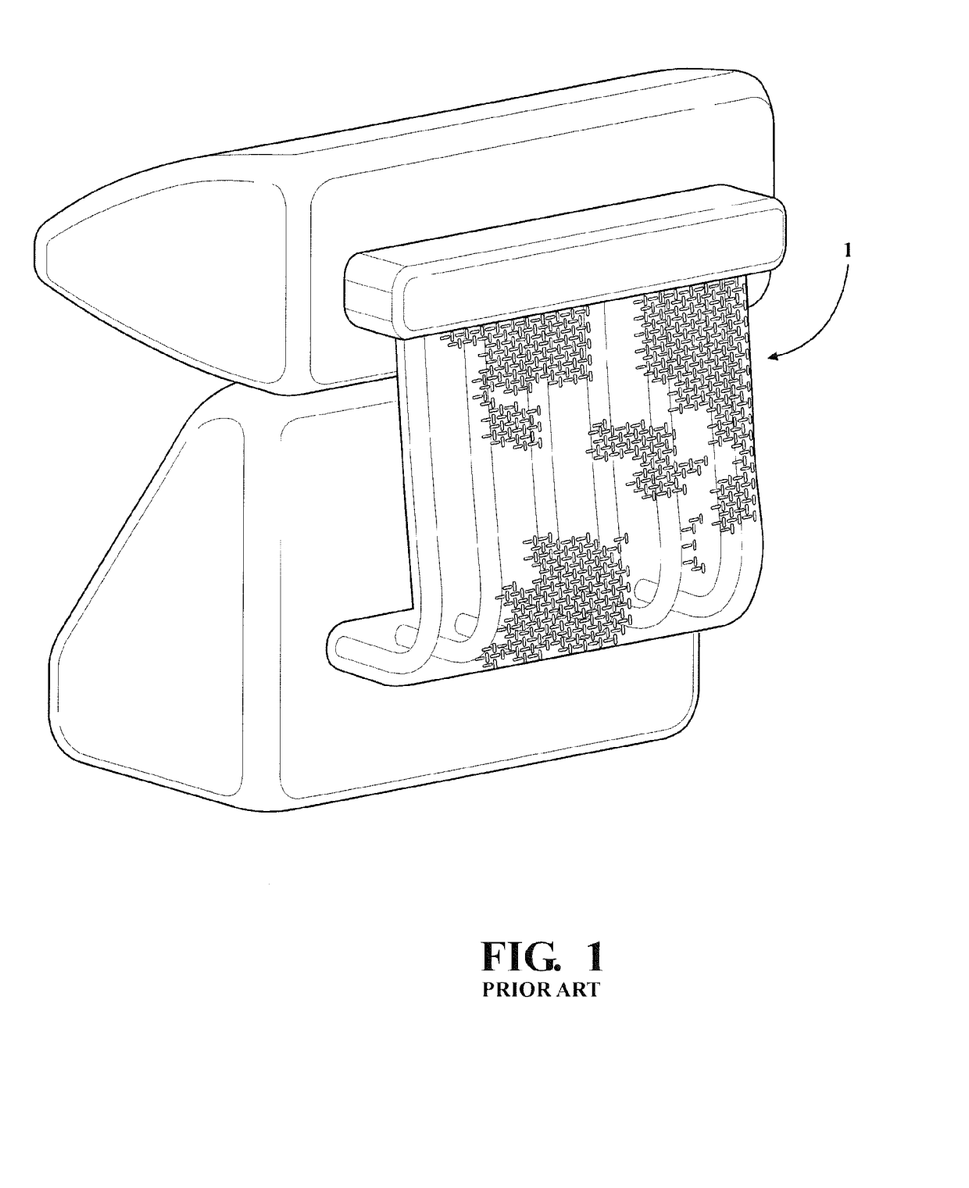
FIG. 1 is a woven EMI shield constructed in accordance with the prior art shown disposed over a plurality of wire bundles.

It is known to fabricate electromagnetic interference (EMI) shields 1 entirely from wire, such as shown in FIG. 1. The wire, being too stiff to be knit, is generally woven to form a mesh of a predetermined mesh size to prevent the passage of EMI therethrough, thereby acting as a barrier or shield to the EMI.

The manufacture of woven wire EMI shields is not a simple process. The metal wire material typically employed in such woven EMI shields is fairly stiff and this lends to the material being generally difficult to weave. Special care must be taken in controlling the process to ensure that a uniform mesh size is achieved and this adds to the cost and complexity of producing such a product. And it is important to control the mesh size to produce an EMI shield with uniform properties and to make certain that the mesh size is not so large as to permit the transmission of EMI through the shield. Careful controls must be in place to obtain a commercially usable product.

A further disadvantage of woven wire EMI shields, apart from the difficulty in manufacturing them, is their robustness when placed in service. When first installed, the mesh size is desirably present in its as-manufactured uniform condition and would be effective at shielding EMI. However, it has been found that the woven nature of such shields enables the relative positions of the wires to shift either during installation or over time, with some of the wires getting pushed closer together while others end up being drawn further apart. Such change in the mesh size is undesirable as it yields inconsistent performance from one product to another and even within the mesh field of a given product. Moreover, in cases where the wires have shifted apart to increase the mesh size (either locally or over a larger region or regions), the increased gap can be large enough to allow EMI to pass through the shield which is highly undesirable.

SUMMARY OF THE INVENTION

In accordance with one aspect of the invention, a knit EMI shield is provided. The knit EMI shield includes a wall of knit nonmetallic yarn and at least one inserted wire. The knit nonmetallic yarn is looped about the inserted wire to maintain the inserted wire in its "as inserted" position, thereby fixing the inserted wire relative to the nonmetallic yarn and relative to itself and/or other inserted wire. Accordingly, the inserted wire is prevented from moving by knit loops of the nonmetallic yarn, thereby maintaining the inserted wire in its optimal EMI shielding position.

In accordance with another aspect of the invention, the inserted wire extends beyond opposite sides of the wall of knit nonmetallic yarn to provide exposed free ends of the wire for operable connection to a source of electrical ground.

In accordance with another aspect of the invention, the wall of knit nonmetallic yarn is warp knit.

In accordance with another aspect of the invention, the wire is inserted in bundles containing a plurality of the wires in side-by-side relation with one another, wherein the individual bundles extend parallel to one another.

In accordance with another aspect of the invention, the knit EMI shield provides crash impact protection and mechanical protection.

In accordance with another aspect of the invention, a method of constructing an EMI shield assembly is provided. The method includes initiating knitting of one or more nonmetallic yarns with one another to form a body including a wall having opposite sides extending generally parallel with one another lengthwise between opposite ends. The method proceeds with the step of laying-in at least one wire into the wall. The next step is forming knit loops of the nonmetallic yarn about the wire. The method further includes the step of capturing the wire in a predetermined position with the loops, wherein the wire is fixed relative to the nonmetallic yarn and relative to other wires.

BRIEF DESCRIPTION OF THE DRAWINGS

These and other aspects, features and advantages of the present invention will become more readily appreciated when considered in connection with the following detailed description of presently preferred embodiments and best mode, appended claims and accompanying drawings, in which:

DETAILED DESCRIPTION OF PRESENTLY PREFERRED EMBODIMENTS

Figure 2:
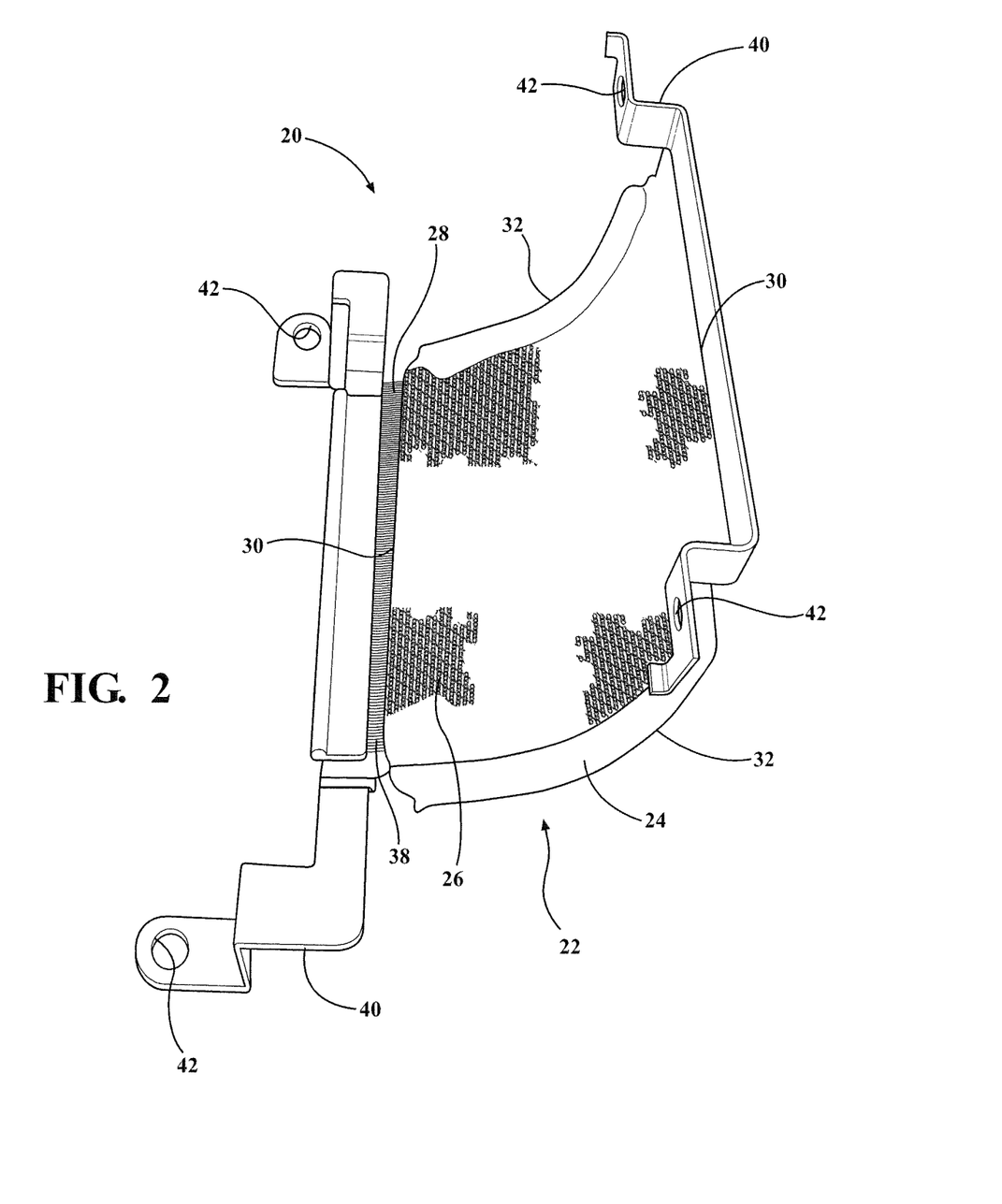
FIG. 2 is an EMI shield constructed in accordance with one embodiment of the invention.

Referring in more detail to the drawings, FIG. 2 illustrates an electromagnetic interference (EMI) shield assembly constructed in accordance with one embodiment of the invention. The EMI shield assembly 20 is operable for attachment to shield a conductor, cable, or plurality thereof, such as high voltage conductors or cables to prevent EMI from having an adverse effect on the conductors or cables, as well as on electronic apparatus nearby the conductors or cables. The EMI shield assembly 20 is also well suited to provide impact crash protection and mechanical protection to the contents thereof.

The EMI shield assembly 20 includes a body 22 having a wall 24 of knit nonmetallic yarn 26 and at least one inserted metal wire 28. The wall 24 has opposite sides 30 that extend generally parallel with one another lengthwise between opposite ends 32. The knit nonmetallic yarn 26 is looped about the wire 28 via knit stitches, also referred to as loops 34 to maintain the wire 28 in its "as inserted" position, thereby fixing the wire 28 relative to the nonmetallic yarn 26 and relative to itself and/or other wires 28. Accordingly, the wire 28 is prevented from moving by the knit stitches or loops 34 (FIG. 5), of the nonmetallic yarn 26, thereby maintaining the inserted wire 28 in its optimal EMI shielding position, as initially inserted and fixed via the loops 34.

Figure 3:
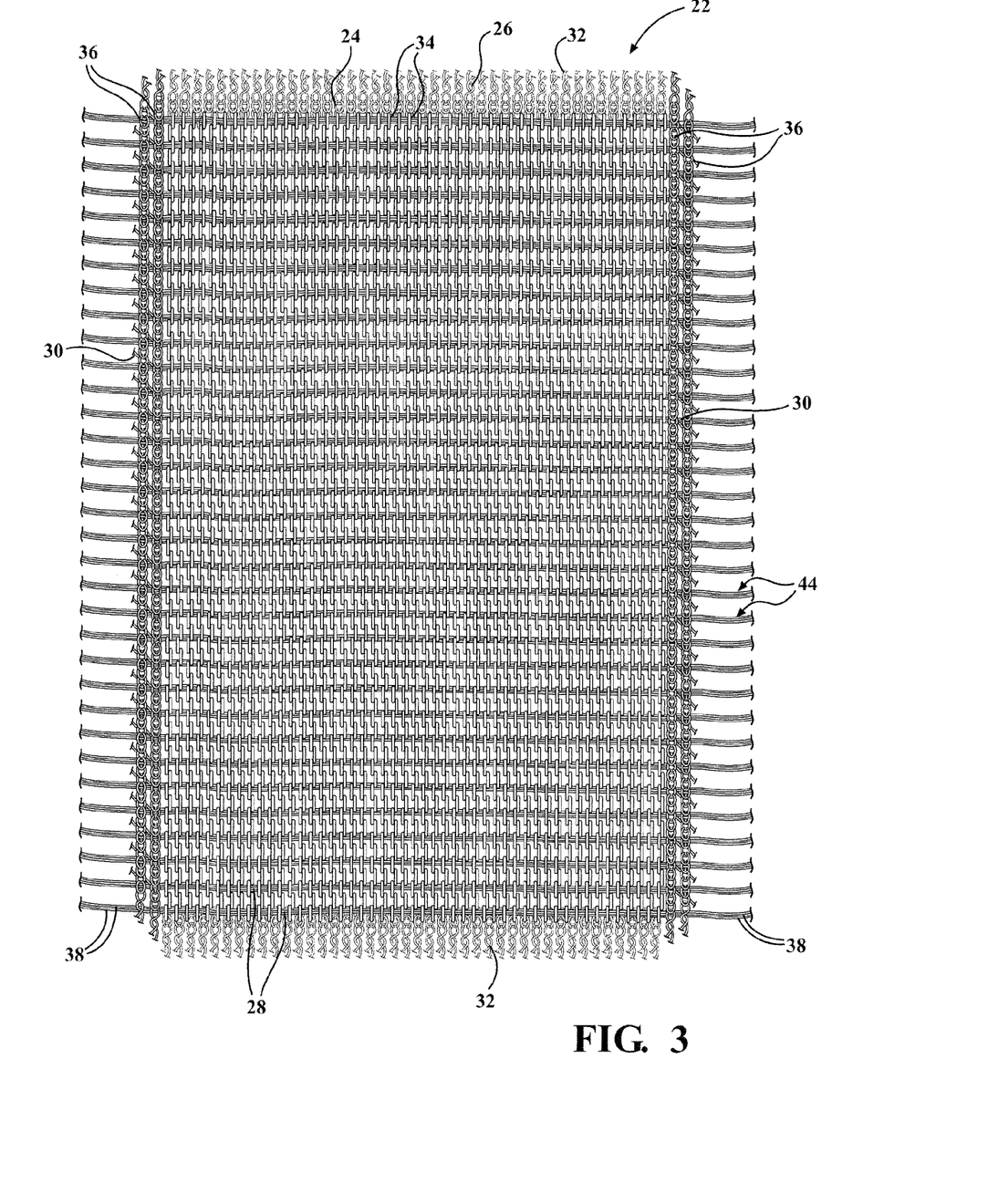
FIG. 3 is a partial front plan view of the EMI shield of FIG. 2.

The wall 24 of knit nonmetallic yarn 26 of the exemplary embodiment is warp knit, and the wire 28 is inserted along a weft direction in the desired position during the warp knitting process to allow the loops 34 to capture and retain the wire 28 or wires 28 in their intended position so that the wire 28 remains fixed relative to the wall 24. In other words, the wire 28 is knit into the wall 24 using a weft insertion or laying-in technique. A knitting machine such as the Mach 2X manufactured by Shima Seiki Mfg., Ltd. may be used to knit the wall 24 of nonmetallic yarn 26, insert the wire 28, and form the EMI shield assembly 20. If warp knit, the wall 24 may be knit using any type of warp knitting such as, but not limited to tricot knit, Milanese knit, or Raschel knit. The wall 24 of the exemplary embodiment also includes a plurality of edge stitches 36 (FIGS. 3 and 5) of the nonmetallic yarn 26 adjacent to the opposite sides 30 of the wall 24 for securing the nonmetallic yarn 26 in the wall 24. The edge stitches 36 can take on many forms, such as, but not limited to selvage-edge knitting, sideways-edge knitting, or cast-on edge knitting. Although the wall 24 of the exemplary embodiment is warp knit and the wire 28 is inserted in a weft direction, it should be understood that the wall 24 could instead be weft knit for example and the wire 28 could then be inserted in a warp direction.

The nonmetallic yarn 26 can be provided as any desired yarn, depending on the application, such as, by way of example and without limitations, polyester, nylon, polypropylene, polyethylene, acrylic, cotton, rayon, and fire retardant (FR) versions of all the aforementioned materials, though high temperature ratings are generally not required if provided as FR materials. If high temperature ratings are desired along with FR capabilities, then some presently preferred nonconductive yarns include m-aramid (Nomex, Conex, Kermel), p-aramid (Kevlar, Twaron, Technora), PEI (Ultem), PPS, and PEEK, for example.

Although not utilized in the exemplary embodiment of the invention, the wall 24 of the nonmetallic yarn 26 may be heat-set to help establish a specific profile or shape of the wall 24. Heat-setting may allow the wall 24 to better conform to a component to which the EMI shield assembly 20 will protect or shield. In the event that the wall 24 is heat-set, the nonmetallic yarns 26 may be chosen to be heat-settable. Heat-setting may also assist in the maintaining of the wire 28 in its "as inserted" position and prevent any movement of the wire 28 relative to the nonmetallic yarn 26 and and/or other wires 28.

The wire 28 of the exemplary embodiment is solid wire 28, however, it should be understood that the wire 28 may instead be stranded or braided, for example. Although solid wire 28 may be more mechanically rugged, stranded or braided wire 28 may be better suited to applications in which the EMI shield assembly 20 experiences bending stress, to provide redundancy, or if the EMI shield assembly 20 must be more flexible. Additionally, each wire 28 may also include jacketing, insulation, or other coating. For example, each wire 28 could include a coating intended to prevent corrosion if the EMI shield assembly 20 is intended to be used in a harsh environment. Coating on the wires 28 may also have the benefit of reducing the occurrence of fretting and can provide a separation of dissimilar metals to slow or stop the galvanic reaction of the wires 28 with any dissimilar metals the wires 28 contact.

Figure 5:
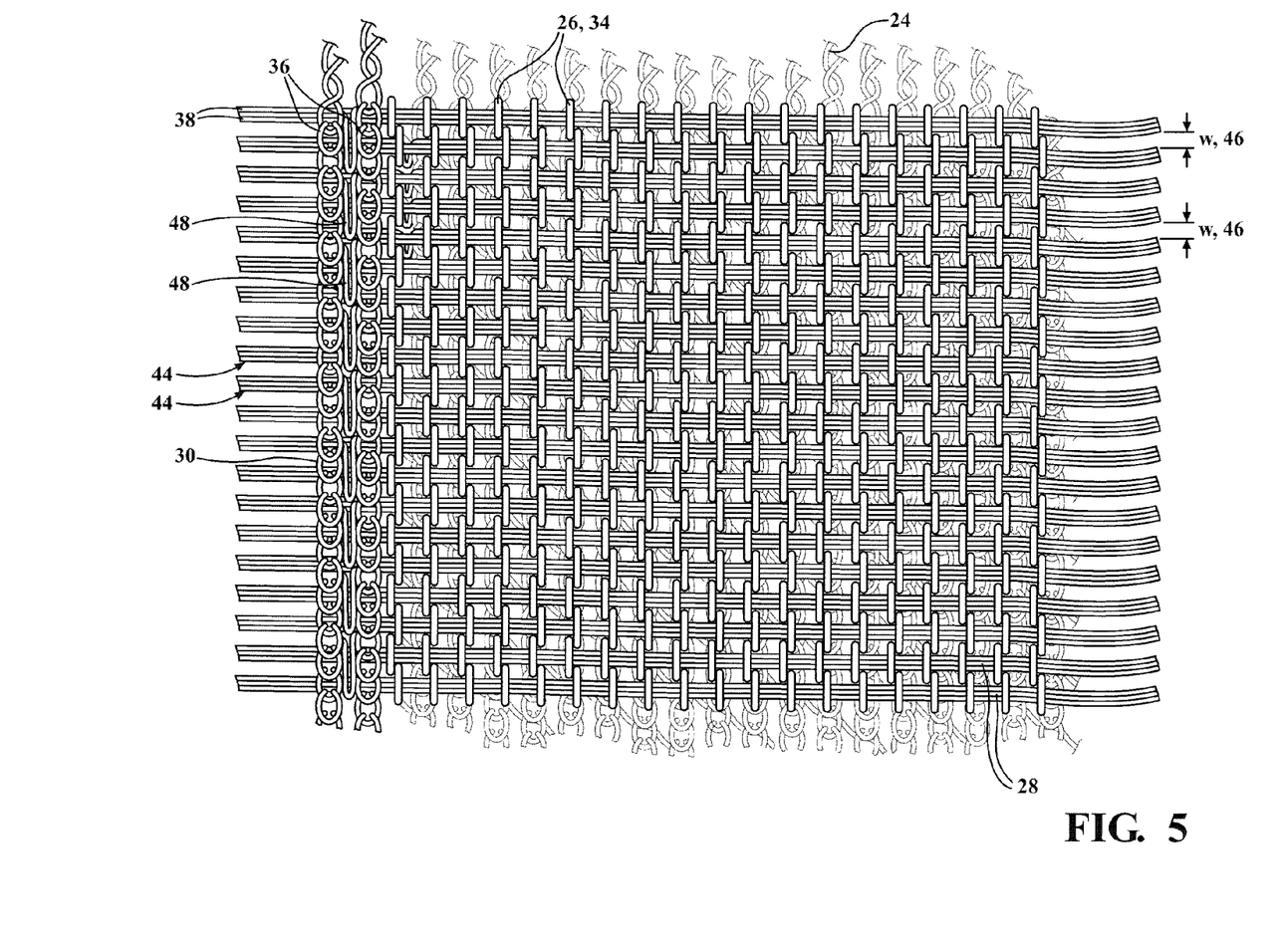
FIG. 5 is an enlarged partial front plan view of the EMI shield of FIG. 3.

The wire 28 is shown as extending beyond the opposite sides 30 of the wall 24 to provide a plurality of exposed free ends 38 extending beyond each of the sides. The free ends 38 are adapted for operable connection to a source of electrical ground. To facilitate attachment to the source of electrical ground, a conductive bracket, such as a metal bracket 40, is operably attached in electrical communication to each of the exposed free ends 38, with each metal bracket 40 being adapted for ready attachment to the source of electrical ground, such as via fastener openings 42 configured to align with corresponding faster receptacles in the member to which the EMI shield assembly 20 is attached. As best shown in FIG. 5, the wire 28 is shown as being inserted to provide discrete bundles 44 of the wire 28, wherein each bundle 44 has a plurality of the wires 28 or segments of the wire 28 arranged in side-by-side relation with one another. The individual bundles 44 extend parallel to one another, with a gap 46 having a predetermined width w extending between the adjacent bundles 44. The width w of each gap 46 is maintained in size during manufacture, assembly and use due to the loops 34 fixing the bundles 44 against relative movement with the wall 24. As such, the bundles 44 are assured of providing continual protection against EMI.

Figure 4:
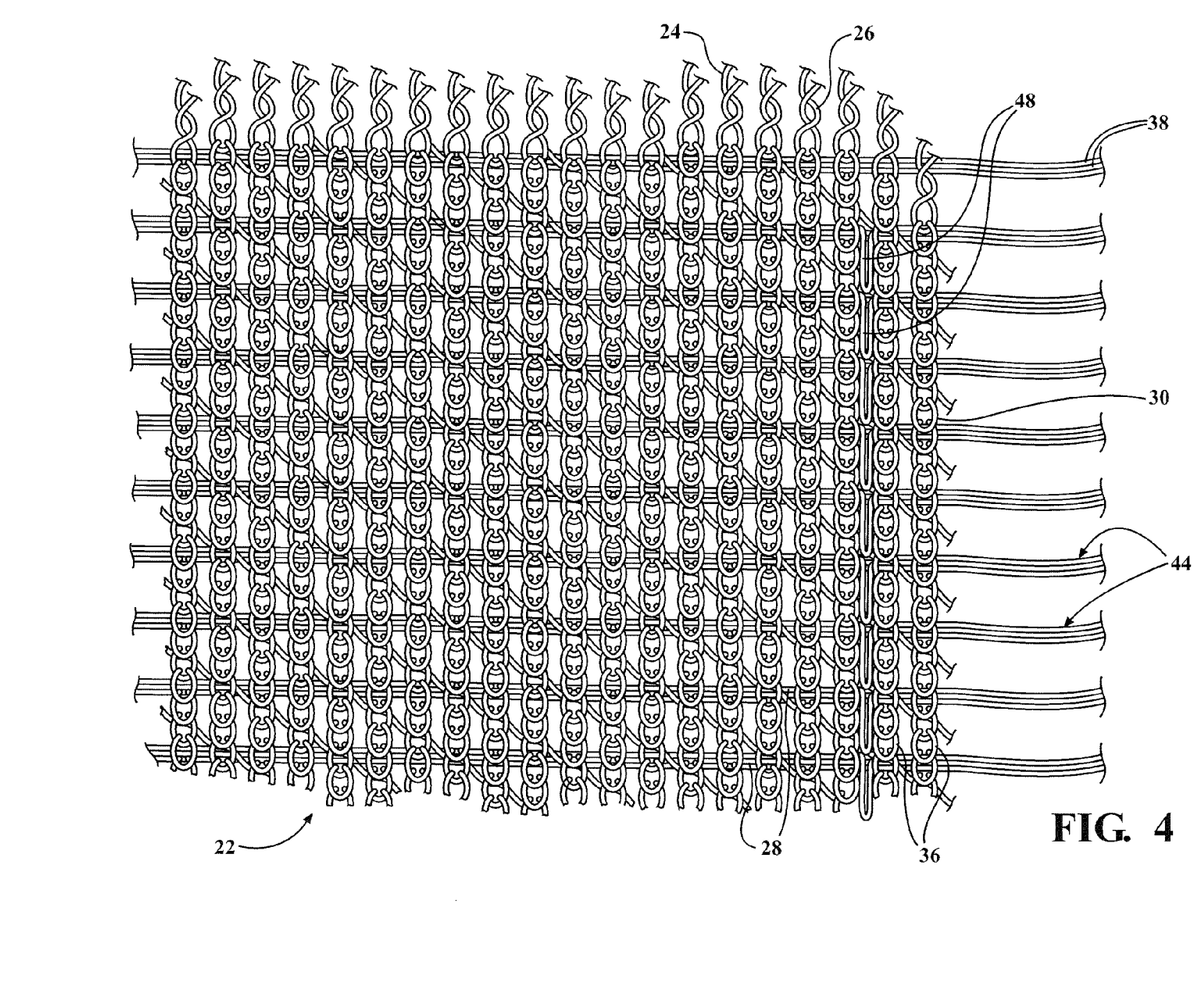
FIG. 4 is an enlarged partial back plan view of the EMI shield of FIG. 2.

As illustrated in FIGS. 4 and 5, wires 28 of the exemplary embodiment of the invention each include at least one bend 48 between their free ends 38 that extends lengthwise between adjacent wales of the edge stitches 36 of the nonmetallic yarn 26. Thus, each wire 28 is captured so that movement of the wire 28 along a widthwise direction between the sides 30 of said wall 24 is prevented. While the loops 34 themselves help establish and retain the arrangement of wires 28 lengthwise relative the wall 24, without any bend 48, the wire 28 may be allowed to slide widthwise out of its "as inserted" position. In some applications, this may be desirable, such as to allow widthwise adjustment of the wire 28, therefore it should be appreciated that wires 28 of other embodiments may not include bends 48 captured between loops 34 of the nonmetallic yarn 26. The knit courses forming the loops 34 of nonmetallic yarn 26 may be formed of the same type of knit stitches as the remainder of the wall 24, or may be formed by different knit stitches.

Figure 6:
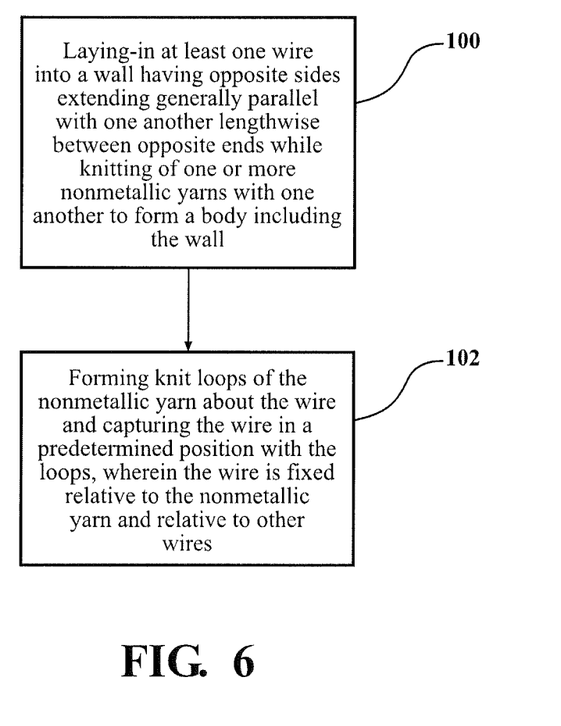
FIG. 6 is a flow chart illustrating the steps of constructing the EMI shield of an embodiment.

As illustrated by a flow chart in FIG. 6, a method of constructing an EMI shield assembly 20 is also disclosed. The method includes the step of 100 laying-in at least one wire 28 into a wall 24 having opposite sides 30 extending generally parallel with one another lengthwise between opposite ends 32 while knitting one or more nonmetallic yarns 26 with one another to form a body 22 including the wall 24. As described above, the wall 24 of nonmetallic yarn 26 is warp knit, therefore in the exemplary embodiment, the step of 100 laying-in at least one wire 28 into a wall 24 having opposite sides 30 extending generally parallel with one another lengthwise between opposite ends 32 while knitting one or more nonmetallic yarns 26 with one another to form a body 22 including the wall 24 is further defined as laying-in at least one wire 28 into the wall 24 along a weft direction while warp knitting of one or more nonmetallic yarns 26. The next step is 102 forming knit loops 34 of the nonmetallic yarn 26 about the wire 28 and capturing the wire 28 in a predetermined position with the loops 34, wherein the wire 28 is fixed relative to the nonmetallic yarn 26 and relative to other wires 28.

The method of constructing the EMI shield assembly 20 of the exemplary embodiment further includes the step of providing a plurality of exposed free ends 38 of the wire 28 extending beyond sides of the wall 24. While the wires 28 of the exemplary embodiment simply are sized to allow the free ends 38 to extend beyond the sides of the wall 24, it should be appreciated that the wall 24 may be trimmed in a secondary operation in order to expose the free ends 38. Consequently, the method may define the step of providing a plurality of exposed free ends 38 of the wires 28 as cutting the wall 24 of the nonmetallic yarn 26 at the opposite sides 30 to expose the free ends 38 of the wire 28. The method of constructing the EMI shield assembly 20 of the exemplary embodiment also includes the step of connecting the free ends 38 to at least one conductive bracket.

Referring back to FIG. 4, the method of constructing the EMI shield assembly 20 of the exemplary embodiment includes bending a portion of the wire 28 and capturing the bent portion between the loops 34 of the nonmetallic of the wall 24. As previously described, the wires 28 of the exemplary embodiment are arranged in side-by-side relation to one another to provide a discrete bundle 44 of a plurality of wires 28. Therefore, the method may also include the step of forming at least one discrete bundle 44 of the wires 28. Furthermore, the method may utilize wires 28 which are stranded or braided. The method of at least one embodiment may further include the step of forming edge stitches 36 with the nonmetallic yarns 26 to finish the opposite sides 30 of the body 22 of the wall 24.

Many modifications and variations of the present invention are possible in light of the above teachings. It is, therefore, to be understood that the invention may be practiced otherwise than as specifically described, and that the scope of the invention is defined by any ultimately allowed claims.

What is claimed is:

1. An EMI shield assembly, comprising;
    a knit wall of nonmetallic yarn extending lengthwise between opposite ends,
    a plurality of wires fixed to said wall by a plurality of loops of said nonmetallic yarn, said plurality of wires extending widthwise between opposite sides of said knit wall in transverse relation to said nonmetallic yarn, and
    said plurality of wires extending beyond each of said opposite sides for operable connection to a source of ground, wherein said plurality of wires extend from adjacent one of said opposite ends to adjacent the other of said opposite ends in laterally spaced relation from one another.

2. The EMI shield assembly as set forth in claim 1 wherein said plurality of wires includes a plurality of discrete bundles of said wires and each of said bundles extends parallel with one another, said bundles being spaced laterally from one another.

3. The EMI shield assembly as set forth in claim 2 wherein a gap having a predetermined width W extends between adjacent said bundles, said gap being maintained by said loops fixing said bundles against relative movement with said wall.

4. The EMI shield assembly as set forth in claim 1 wherein said plurality of wires are stranded.

5. The EMI shield assembly as set forth in claim 1 wherein said plurality of wires are braided.

6. The EMI shield assembly as set forth in claim 1 wherein said plurality of wires are insulated.

7. The EMI shield assembly as set forth in claim 1 wherein said plurality of wires includes a plurality of free ends and at least one bend extending lengthwise between adjacent wales of said loops of said nonmetallic yarn.

8. The EMI shield assembly as set forth in claim 1 wherein said wall is formed by more than one type of knit pattern.

9. The EMI shield assembly as set forth in claim 1 wherein said wall includes a plurality of edge stitches of said nonmetallic yarn adjacent said opposite sides of said wall.

10. The EMI shield assembly as set forth in claim 1 wherein said plurality of wires includes a plurality of free ends and said assembly further includes conductive brackets extending lengthwise along said opposite sides between said opposite sides and being operably attached to each of said free ends.

11. A method of constructing an EMI shield assembly comprising the steps of:
    laying-in a plurality of wires into a wall having opposite sides extending generally parallel with one another lengthwise between opposite ends while knitting one or more nonmetallic yarns with one another to form a body including the wall,
    forming knit loops of the nonmetallic yarn about the plurality of wires and capturing the plurality of wires in a predetermined position with the loops, wherein the plurality of wires is fixed relative to the nonmetallic yarn and relative to other wires, and wherein the plurality of wires extend from adjacent of the opposite ends to the other of the opposite ends in laterally spaced relation from one another and wherein the plurality of wires extend beyond the opposite sides.

12. The method of claim 11 wherein the step of laying-in at least one wire into a wall having opposite sides extending generally parallel with one another lengthwise between opposite ends while knitting one or more nonmetallic yarns with one another to form a body including the wall is further defined by laying in the plurality of wires into the wall along a weft direction while warp knitting of one or more nonmetallic yarns.

13. The method of claim 11 further including connecting the free ends to at least one conductive bracket, wherein the bracket extends along the opposite sides and between the opposite ends.

14. The method of claim 11 further defining providing a plurality of exposed free ends of the wires by cutting the wall of the nonmetallic yarn at the opposite sides to expose the free ends of the wire.

15. The method of claim 11 further including forming the plurality of wires as a plurality of discrete bundles of wires.

16. The method of claim 11 wherein the plurality of wires are stranded.

17. The method of claim 11 further including forming edge stitches with the nonmetallic yarns to finish the opposite sides of the body of the wall.

18. The method of claim 11 further including bending a portion of the plurality of wires and capturing the bent portion between the loops of adjacent wales of the nonmetallic yarn of the wall.

19. The method of claim 11 wherein the step of laying-in the plurality of wires into the wall is further defined as creating a gap extending between adjacent wires and maintaining the gap between the wires in their predetermined positions.

* * * * *